US008537038B1

(12) United States Patent
Semenyuk et al.

(10) Patent No.: US 8,537,038 B1
(45) Date of Patent: Sep. 17, 2013

(54) EFFICIENT COMPRESSION METHOD FOR SORTED DATA REPRESENTATIONS

(75) Inventors: Vladimir Semenyuk, Pacific Grove, CA (US); Serge Volkoff, San Bruno, CA (US)

(73) Assignee: Smith Micro Software, Inc., Aliso Viejo, CA (US)

( * ) Notice: Subject to any disclaimer, the term of this patent is extended or adjusted under 35 U.S.C. 154(b) by 16 days.

(21) Appl. No.: 13/280,316

(22) Filed: Oct. 24, 2011

Related U.S. Application Data

(60) Provisional application No. 61/406,088, filed on Oct. 22, 2010.

(51) Int. Cl.
*H03M 7/00* (2006.01)
(52) U.S. Cl.
USPC ............ 341/107; 341/51; 341/65; 341/67; 341/106
(58) Field of Classification Search
USPC .................. 341/50, 51, 65, 67, 106, 107
See application file for complete search history.

(56) References Cited

U.S. PATENT DOCUMENTS

| 4,494,108 | A  | * | 1/1985  | Langdon et al. | 341/51  |
|-----------|----|---|---------|----------------|---------|
| 5,717,394 | A  | * | 2/1998  | Schwartz et al.| 341/51  |
| 6,678,419 | B1 | * | 1/2004  | Malvar         | 382/240 |
| 6,756,921 | B2 | * | 6/2004  | Kimura et al.  | 341/50  |
| 6,895,101 | B2 | * | 5/2005  | Celik et al.   | 382/100 |
| 6,937,664 | B1 | * | 8/2005  | Park et al.    | 375/259 |
| 6,956,510 | B1 | * | 10/2005 | He et al.      | 341/58  |
| 7,286,710 | B2 | * | 10/2007 | Marpe et al.   | 382/239 |
| 7,379,608 | B2 | * | 5/2008  | Marpe et al.   | 382/247 |
| 7,421,138 | B2 | * | 9/2008  | Van Der Vleuten| 382/244 |
| 8,295,342 | B2 | * | 10/2012 | Chen et al.    | 375/240.01 |
| 8,311,504 | B2 | * | 11/2012 | Rofougaran     | 455/277.1 |
| 8,331,505 | B2 | * | 12/2012 | Abrishamkar et al.| 375/346 |
| 2006/0103556 | A1 | * | 5/2006 | Malvar        | 341/63  |
| 2012/0044097 | A1 | * | 2/2012 | Chan et al.   | 341/87  |
| 2013/0027230 | A1 | * | 1/2013 | Marpe et al.  | 341/107 |

OTHER PUBLICATIONS

M. Burrows and D.J. Wheeler, "A Block-Sorting Lossless Data Compression Algorithm", DEC SRC Research Report 124, May 1994.
M. Schindler, "A Fast Block-Sorting Algorithm for Lossless Data Compression", Vienna University of Technology, Karlsplatz 13/1861, A-1040 Vienna, Austria. michael@eiunix.tuwien.ac.at.

(Continued)

*Primary Examiner* — Linh Nguyen
(74) *Attorney, Agent, or Firm* — Craig M. Stainbrook; Stainbrook & Stainbrook, LLP

(57) ABSTRACT

A method of compressing sorted data representation symbols sequentially. Steps include determining whether a symbol currently being encoded is identical to an immediately preceding symbol; encoding the result as a binary event; if the symbols are identical, encoding the symbol ends; if the symbols are different and there is a constant difference between several previous pairs of symbols, determining whether the difference between the current symbol a and the symbol immediately preceding it b is the same as the difference between the symbol b and the symbol immediately preceding it c, and encoding the determination result as another binary event; in the case of positive result of the latest determination, encoding the symbol ends; otherwise, encoding the symbol using a bitwise operation in which bits of the symbol's binary representation are processed sequentially from the most significant bit to the least significant bit. A corresponding decompression method is provided.

23 Claims, 2 Drawing Sheets

(56) References Cited

OTHER PUBLICATIONS

S. Albers, "Improved randomized on-line algorithms for the list update problem", SIAM Journal on Computing, vol. 27, No. 3. pp. 682-693, 1998.

S. Albers and M. Mitzenmacher, "Average case analyses of list update algorithms, with applications to data compression", Algorithmica (1998) 21: 312-329.

Z. Arnavut and S. Magliveras. "Block sorting and compression", Proc. IEEE Data Compression Conference (DCC '97), pp. 181-190, 1997.

B. Balkenhol, S. Kurtz, and Y. Shtarkov. Modifications of the Burrows and Wheeler Data Compression Algorithm), Proc. IEEE Data Compression Conference (DCC '99), pp. 188-197, 1999.

E. Binder, "Distance Coder", comp.compression, 2000.

S. Deorowicz, "Improvements to Burrows-Wheeler compression algorithm", Softw. Pract. Exper: 2000, 30:1465-1483.

S. Deorowicz, "Second step algorithms in the Burrows-Wheeler compression algorithm", Softw. Pract. Exper; 32-99-111, 2002.

F. Ghido. QLFC—a compression algorithm using the Burrows-Wheeler transform. Proceedings of the 2005 Data compression Conference (DCC '05).

* cited by examiner

EFFICIENT COMPRESSION METHOD FOR SORTED DATA REPRESENTATIONS

CROSS REFERENCES TO RELATED APPLICATIONS

The present application claims the benefit of U.S. Provisional Patent Application Ser. No. 61/406,088, filed Oct. 22, 2010.

STATEMENT REGARDING FEDERALLY SPONSORED RESEARCH OR DEVELOPMENT

Not applicable.

THE NAMES OR PARTIES TO A JOINT RESEARCH AGREEMENT

Not applicable.

INCORPORATION-BY-REFERENCE OF MATERIAL SUBMITTED ON A COMPACT DISC

Not applicable.

BACKGROUND OF THE INVENTION

1. Field of the Invention

The present invention relates to the field of general purpose lossless data compression based on block sorting. More specifically, the present invention relates to compression of sorted data representations obtained as a result of the Burrows-Wheeler Transform (BWT) [as described in M. Burrows, D. J. Wheeler, "A Block-Sorting Lossless Data Compression Algorithm", Res. rept. 124, DIGITAL Systems Research Center, 1994], or the Sort Transform (ST) [described in M. Schindler, "A Fast Block-sorting Algorithm for Lossless Data Compression", Proc. IEEE Data Compression Conference (DCC '97), pp. 469, 1997].

2. Background Discussion

Lossless compression is a process of obtaining economical representation of source information. Lossless compression methods are used in many areas, principally including data storage and data transmission. General-purpose lossless compression methods represent a universal approach to the problem. These methods are universal in terms of the kinds of data for which they are designed.

There are several approaches to the general-purpose lossless compression problem. One of the most efficient is block sorting compression first introduced by M. Burrows and D. J. Wheeler. The Burrows-Wheeler (BW) compression process consists of two stages: transform stage and encoding stage. In the first stage symbols of the original data block are permuted with the use of the Burrows-Wheeler Transform or its modification—the Sort Transform. In the both cases the symbols are put into an order determined by the lexicographic ordering of their contexts. High probability of coincidence of symbols occurring in similar contexts makes the new representation much more suitable for compression. In the second stage a dedicated lossless compression algorithm is sequentially (symbol-by-symbol) applied to the reordered (sorted) block to obtain a compressed data representation. Decompression becomes possible due to the reversibility of the transform and application of the zero-loss second stage compression algorithm.

Since the actual compression is performed in the second stage, one of the most important problems is finding an efficient compression method for sorted representations. Although sorted representations are convenient for compression, the best results are obtained with the use of nontrivial approaches.

There are two main approaches to compression of sorted representations. The first approach uses dynamic symbol ranking. Symbols are dynamically ranked using an appropriate rule. Typically, most recently processed symbols are assigned lower ranks During encoding (decoding) ranks, rather than symbols, are encoded (decoded) using various probabilistic methods. Rank encoding is frequently supplemented by run-length encoding as an efficient method of processing series of repeating symbols. The use of run-length encoding significantly reduces the computational complexity of an algorithm. Known ranking methods are: (1) Move-To-Front (MTF) [see M. Burrows, D. J. Wheeler, "A Block-Sorting Lossless Data Compression Algorithm", Res. rept. 124, DIGITAL Systems Research Center, 1994; see also, B. Balkenhol, S. Kurtz, Y. M. Shtarkov, "Modifications of the Burrows and Wheeler Data Compression Algorithm", Proc. IEEE Data Compression Conference (DCC '99), pp. 188-197, 1999]; (2) Inversion Frequencies (IF) [Z. Arnavut, S. S. Magliveras, "Block Sorting and Compression", Proc. IEEE Data Compression Conference (DCC '97), pp. 181-190, 1997]; (3) Distance Coding (DC) [E. Binder, "Distance Coder", comp. compression, 2000]; (4) Time Stamp (TS) [see, S. Albers, "Improved randomized on-line algorithms for the list update problem", Proc. 6th Annual ACM-SIAM Symposium on Discrete Algorithms, pp. 412-419, 1995; see also, S. Albers, M. Mitzenmacher, "Average Case Analyses of List Update Algorithms, with Applications to Data Compression", Algorithmica, vol. 21, no. 3, pp. 312-329, 1998]; (5) Weighted Frequency Count (WFC) [see, S. Deorowicz, "Improvements to Burrows-Wheeler compression algorithm", Software—Practice and Experience, vol. 30, no. 13, pp. 1465-1483, 2000; see also, S. Deorowicz, "Second step algorithms in the Burrows-Wheeler compression algorithm", Software-Practice and Experience, vol. 32, no. 2, pp. 99-111, 2002]; and (6) QLFC [F. Ghido, "QLFC—A Compression Algorithm Using the Burrows-Wheeler Transform", Proc. IEEE Data Compression Conference (DCC '05), pp. 459, 2005].

An alternative approach implies using complicated adaptive probabilistic modeling in the symbol domain. In this technique, the probability of a symbol's appearance is estimated using the statistics of symbol appearances in already processed data. Most advanced technologies use binary context-based probabilistic models. Code is usually generated with the use of arithmetic encoding. There are many practical efforts currently being made in this direction. Although some projects are open source, no specific algorithms or unique methods have been publicly introduced (i.e., described in papers or patents).

Solutions of the first type use an indirect approach to information modeling in which the specifics of the original data are replaced by the rank specifics. Such an approach, although having several advantages, makes modeling less effective and results in larger encoded data sizes.

Although there were no efforts to properly expose the original ideas behind existing direct probabilistic methods, according to the information derived from open sources, existing algorithms that use this approach, especially those using binary oriented modeling, are impractical and unacceptable in many situations because of their extremely high computational complexity. Accordingly, it is desirable to have a new method of compressing sorted data presentations that outperforms known methods.

Certain portions of the detailed description set out below employ algorithms, arithmetic, or other symbolic representations of operations performed on data stored within a computing system. The terminology and nomenclature employed are common among those with skill in the art to communicate the substance of their understanding to others similarly skilled and knowledgeable. It will be understood that the operations discussed are performed on electrical and/or magnetic signals stored or capable of being stored, as bits, data, values, characters, elements, symbols, characters, terms, numbers, and the like, within the computer system processors, memory, registers, or other information storage, transmission, or display devices. The operations, actions or processes involve the transformation of physical electronic and/or magnetic quantities within such storage, transmission, or display devices.

DESCRIPTION OF THE INVENTION

Figure 1:
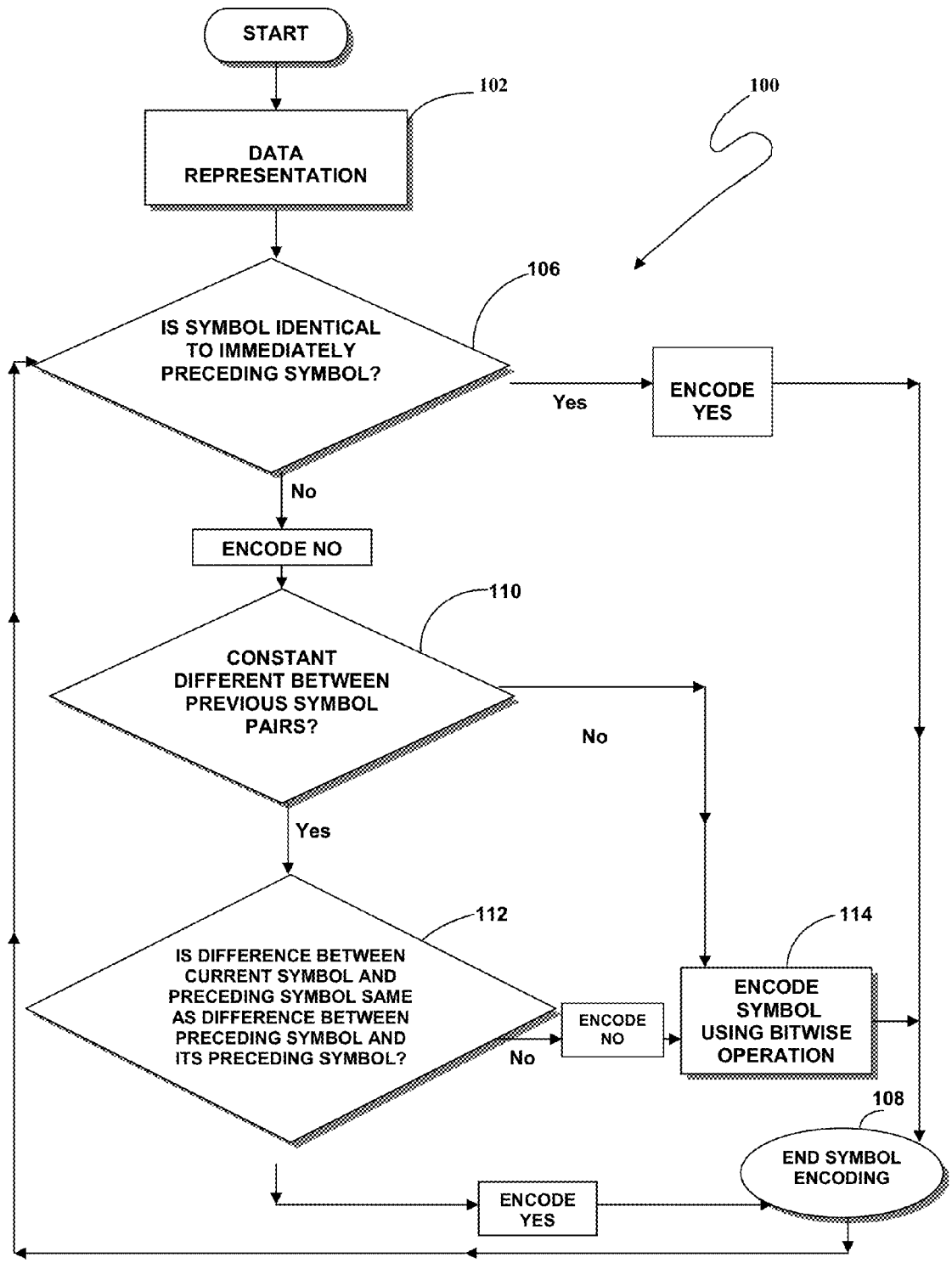
FIG. 1 is a schematic block diagrammatic flow chart showing the efficient method for compressing sorted data representations of the present invention.

The present invention is a lossless compression method designed mainly for compressing sorted data representations in the second stage of a Burrows-Wheeler compression process. The inventive method provides a good trade-off between efficiency and speed. The efficiency of the algorithms that implement this method is comparable to the efficiency of the best-known probabilistic compression algorithms while their computational complexity is significantly lower. Although implementations of the method are usually slower than simpler ranking-based algorithms on redundant data, these implementations outperform ranking-based algorithms on information with low redundancy.

The sorted representation is processed (encoded or decoded) sequentially, symbol-by-symbol. A two-state (binary) event—whether the current symbol is identical to the previous symbol or different from it—is processed first. If the current symbol is the same as the previous symbol, the processing of the symbol is finished. If not, a delta processing possibility check is performed. If there is a constant difference between several previous pairs of symbols, the following binary event is processed: whether the difference between the current symbol and the previous symbol is the same as the difference between the previous symbol and the symbol preceding it. If delta processing is applied and differences are identical, the processing of the symbol is finished. Otherwise, the symbol is processed using a bitwise procedure: the bits of the symbol's binary representation are processed sequentially from the most significant bit to the least significant bit.

The proposed method can be better understood if described using algorithmic notation:
1. i :=0;
2. i :=i+1;
3. ENCODE/DECODE (S[i]=S[i−1]);
4. if S[i]=S[i−1] go to 2;
5. if S[i−1]−S[i−2]=S[i−2]−S[i−3]=S[i−3]−S[i−4] . . . ;
a. ENCODE/DECODE (S[i]−S[i−1]=S[i−1]−S[i−2]);
b. if S[i]−S[i−1]=S[i−1]−S[i−2] go to 2;
6. b=MSB, . . . , LSB: ENCODE/DECODE ((S[i][b]);
7. go to 2.
Wherein,
S[i]—i-th symbol in data representation,
S[i][b]—b-th bit of i-th symbol in data representation,
MSB/LSB—most significant bit/least significant bit.

A complicated context-based mixed statistical binary modeling can be used during processing of binary events and symbol representation bits. Most resent binary events, already processed bits of the current symbol's binary representation, previous symbols, and/or particular bits of their binary representation can be taken into account during the estimation of the probability of a binary event or a bit appearance. Arithmetic coding can be applied for code generation.

As a further improvement, parts of the sorted representation can be analyzed in order to detect invariable bits of a symbol's binary representation. Invariable bits are skipped during processing.

Variation of the method is proposed to improve the speed. Run-length encoding can be used instead of the binary event processing. Simpler alphabet-based encoding methods can replace bitwise encoding of symbol's binary representation.

From the foregoing, and by way of reference first to FIG. 1, it will be appreciated that the method 100 is a method of sequentially compressing data on a symbol-by-symbol basis, and the method includes the following steps: (a) determining whether a symbol currently being encoded is identical to an immediately preceding symbol 106; (b) encoding the result of step (a) as a binary event (c) if the result in step (a) is positive, ending the encoding of the symbol 108; (d) if the result in step (a) is negative, proceeding to step (d); (d) determining, whether there is a constant difference between several previous pairs of symbols 110; (e) if the result in step (d) is positive: (i) determining, whether the difference between the current symbol a and the symbol immediately preceding it b is the same as the difference between the symbol b and the symbol immediately preceding it c 112; (ii) encoding the result of step (i) as a binary event; (1) if the result in substep (i) is positive, ending the encoding of the symbol 108; (2) if the result in substep (i) is negative, proceeding to step (g); (f) if the result in step (d) is negative, proceeding to step (f); (g) encoding the symbol using a bitwise operation in which bits of the symbol's binary representation are processed sequentially from the most significant bit to the least significant bit 114. In some applications, steps (e), (f), and (g) can be omitted.

Figure 2:
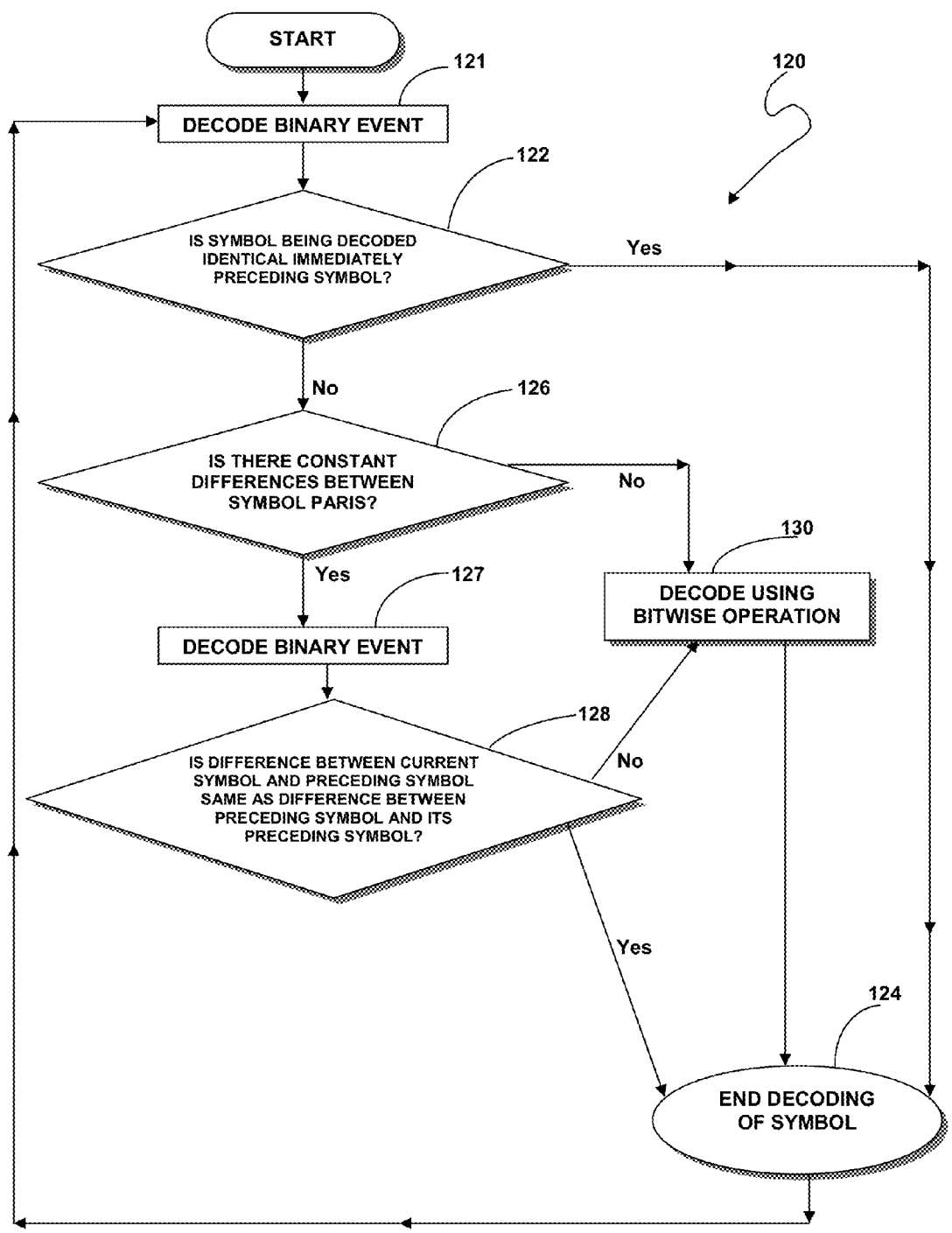
FIG. 2 is a schematic block diagrammatic flow chart showing the method steps for sequentially decompressing a compressed data representation achieved using the compression method illustrated in FIG. 1.

Next, and now with reference to FIG. 2, it will be appreciated that the inventive compression method includes and calls for a complementary method 120 of sequentially decompressing a compressed data achieved using the compression method set out in the immediately preceding paragraph, also on a symbol-by-symbol basis, the decompression method including the steps of: (a) decoding a binary event 121 determining whether a symbol currently being decoded is identical to an immediately preceding symbol by decoding a binary event 122 encoded in step (a) of the inventive compression method set out in the immediately preceding paragraph; (b) if the result in step (a) is positive, ending the decoding 124 of the symbol; (c) if the result in step (a) is negative, proceeding to step (d); (d) determining 126 whether there is a constant difference between several previous pairs of symbols; (e) if the result in step (d) is positive: (i) encoding a binary event 127 determining whether the difference between the current symbol a and the symbol immediately preceding it b is the same as the difference between the symbol b and the symbol immediately preceding it c 128 by decoding a binary event encoded in step (ii) of claim 1; (ii) if the result in step (i) is positive, ending the decoding 124 of the symbol; (iii) if the result in step (i) is negative, proceeding to step (g); (f) if the result in step (d) is negative, proceeding to step (g); (g) decoding the symbol 130 using a bitwise operation in which bits of the symbol's binary representation are processed sequentially from the most significant bit to the least significant bit. In some applications, steps (d), (e), and (f) can be omitted.

What is claimed as invention is:

1. A method of sequentially compressing data, on a symbol-by-symbol basis, said method comprising the steps of:
    (a) determining whether a symbol currently being encoded is identical to an immediately preceding symbol;
    (b) encoding the result of step (a) as a binary event;
    (c) if the result in step (a) is positive, ending the encoding of the symbol;
    (d) if the result in step (a) is negative, proceeding to step (e);
    (e) determining, whether there is a constant difference between several previous pairs of symbols;
    (f) if the result in step (e) is positive:
        (i) determining, whether the difference between the current symbol a and the symbol immediately preceding it b is the same as the difference between the symbol b and the symbol immediately preceding it c;
        (ii) encoding the result of step (i) as a binary event;
        (iii) if the result in step (i) is positive, ending the encoding of the symbol;
        (iv) if the result in step (i) is negative, proceeding to step (h);
    (g) if the result in step (e) is negative, proceeding to step (h);
    (h) encoding the symbol using a bitwise operation in which bits of the symbol's binary representation are processed sequentially from the most significant bit to the least significant bit.

2. A method of sequentially decompressing a compressed data representation achieved using the method of claim 1, on a symbol-by-symbol basis, said method comprising the steps of:
    (i) determining whether a symbol currently being decoded is identical to an immediately preceding symbol by decoding a binary event encoded in step (a) of claim 1;
    (j) if the result in step (a) is positive, ending the decoding of the symbol;
    (k) if the result in step (a) is negative, proceeding to step (d);
    (l) determining, whether there is a constant difference between several previous pairs of symbols;
    (m) if the result in step (d) is positive:
        (i) determining, whether the difference between the current symbol a and the symbol immediately preceding it b is the same as the difference between the symbol b and the symbol immediately preceding it c by decoding a binary event encoded in step (ii) of claim 1;
        (ii) if the result in step (i) is positive, ending the decoding of the symbol;
        (iii) if the result in step (i) is negative, proceeding to step (g);
    (n) if the result in step (d) is negative, proceeding to step (g);
    (o) decoding the symbol using a bitwise operation in which bits of the symbol's binary representation are processed sequentially from the most significant bit to the least significant bit.

3. The compression method of claim 1, wherein two and more pairs of symbols are used in step (f).

4. The decompression method of claim 2 wherein two or more pairs of symbols are used in step (d), and further wherein two or more symbols are used in step (f) of the compression method of claim 1.

5. The compression method of claim 1, further including the steps of detecting invariable bits of a symbol's binary representation before step (g), and skipping decoding of detected invariable bits in step (g).

6. The decompression method of claim 2, further including the steps of detecting invariable bits of a symbol's binary representation before step (f), and skipping decoding of detected invariable bits in step (f), and wherein the compression method of claim includes the step of detecting invariable bits of a symbol's binary representation before step (g), and skipping decoding of detected invariable bits in step (g).

7. The compression method of claim 1, wherein step (b) is accomplished using arithmetic coding.

8. The decompression method of claim 2 corresponding to the compression method of claim 10, wherein step (a) is accomplished using arithmetic coding.

9. The compression method of claim 1, wherein step (ii) is accomplished using arithmetic coding.

10. The decompression method of claim 2, wherein step (i) is accomplished using arithmetic coding, and further wherein step (ii) of the compression method of claim 1 is accomplished using arithmetic coding.

11. The compression method of claim 1, wherein step (h) is accomplished using arithmetic coding.

12. The decompression method of claim 2, wherein step (g) is accomplished using arithmetic coding, and further wherein step (h) of the compression method of claim 1 is accomplished using arithmetic coding.

13. The compression method of claim 1, wherein step (b) is accomplished using context-based mixed statistical binary modeling during encoding of binary events.

14. The decompression method of claim 2, wherein step (a) is accomplished using context-based mixed statistical binary modeling during decoding of binary events, and further wherein step (b) of the compression method of claim 1 is accomplished using context-based mixed statistical binary modeling during encoding of binary events.

15. The compression method of claim 1, wherein step (ii) is accomplished using context-based mixed statistical binary modeling during encoding of binary events.

16. The decompression method of claim 2, wherein step (i) is accomplished using context-based mixed statistical binary modeling during decoding of binary events, and further wherein step (ii) of the compression method of claim 1 is accomplished using context-based mixed statistical binary modeling during encoding of binary events.

17. The compression method of claim 1, wherein step (h) is accomplished using context-based mixed statistical binary modeling during encoding of bits of symbol's binary representation.

18. The decompression method of claim 2, wherein step (g) is accomplished using context-based mixed statistical binary modeling during decoding of binary events, and further wherein step (h) of the compression method of claim 1 is accomplished using context-based mixed statistical binary modeling during encoding of bits of symbol's binary representation.

19. The method of claim 1, further including the step of estimating the probability of a binary event or a bit appearance, wherein recent binary events, already processed bits of the current symbol's binary representation, previous symbols, and/or particular bits of their binary representation are taken into consideration in performing the probability estimation calculation.

20. The compression method of claim 1, wherein run-length encoding is performed in step (b).

21. The decompression method of claim 2, wherein run-length decoding is performed in step (a), and further wherein run-length encoding is performed in step (b) of the compression method of claim 1.

22. The compression method of claim 1, wherein run-length encoding is performed in step (ii).

23. The decompression method of claim 2, wherein run-length decoding is performed in step (i), and further wherein run-length encoding is performed in step (ii) of the compression method of claim 1.

* * * * *